(12) United States Patent
Wan et al.

(10) Patent No.: US 7,450,433 B2
(45) Date of Patent: Nov. 11, 2008

(54) WORD LINE COMPENSATION IN NON-VOLATILE MEMORY ERASE OPERATIONS

(75) Inventors: Jun Wan, Sunnyvale, CA (US); Jeffrey W. Lutze, San Jose, CA (US); Chan-Sui Pang, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/025,620

(22) Filed: Dec. 29, 2004

(65) Prior Publication Data
US 2006/0140012 A1   Jun. 29, 2006

(51) Int. Cl.
*G11C 11/34* (2006.01)
(52) U.S. Cl. .............................. 365/185.29; 365/185.17
(58) Field of Classification Search ............ 365/185.29, 365/185.17
See application file for complete search history.

(56) References Cited

U.S. PATENT DOCUMENTS

| | | | | |
|---|---|---|---|---|
| 4,489,400 | A | * | 12/1984 | Southerland, Jr. ............ 365/104 |
| 4,580,247 | A | * | 4/1986 | Adam ...................... 365/185.1 |
| 4,908,834 | A | * | 3/1990 | Wiedemer ................... 380/228 |
| 5,293,337 | A | | 3/1994 | Aritome et al. |
| 5,428,568 | A | | 6/1995 | Kobayashi et al. |
| 5,491,809 | A | | 2/1996 | Coffman et al. |
| 5,570,315 | A | | 10/1996 | Tanaka et al. |
| 5,576,993 | A | | 11/1996 | Hong |
| 5,652,719 | A | | 7/1997 | Tanaka et al. |
| 5,768,188 | A | * | 6/1998 | Park et al. .............. 365/185.03 |
| 5,808,338 | A | | 9/1998 | Gotou |
| 5,841,721 | A | | 11/1998 | Kwon et al. |

(Continued)

FOREIGN PATENT DOCUMENTS

WO   2000024002   4/2000

(Continued)

OTHER PUBLICATIONS

Tetsuo Endoh, et al., "A Study of High-Performance NAND Structured EEPROMS," IEICE Transactions on Electronics, Electronics Society, Tokyo, Japan, vol. E75-C, No. 11, Nov. 1, 1992, pp. 1351-1356.

(Continued)

*Primary Examiner*—Michael Tran
(74) *Attorney, Agent, or Firm*—Vierra Magen Marcus & DeNiro LLP

(57) ABSTRACT

Compensation voltage(s) are applied to a non-volatile memory system during erase operations to equalize the erase behavior of memory cells. Compensation voltages can compensate for voltages capacitively coupled to memory cells of a NAND string from other memory cells and/or select gates. A compensation voltage can be applied to one or more memory cells to substantially normalize the erase behavior of the memory cells. A compensation voltage can be applied to end memory cells of a NAND string to equalize their erase behavior with interior memory cells of the NAND string. A compensation voltage can also be applied to interior memory cells to equalize their erase behavior with end memory cells. Additionally, a compensation voltage can be applied to one or more select gates of a NAND string to compensate for voltages coupled to one or more memory cells from the select gate(s). Various compensation voltages can be used.

39 Claims, 12 Drawing Sheets

U.S. PATENT DOCUMENTS

| | | | |
|---|---|---|---|
| 5,963,477 | A | 10/1999 | Hung |
| 5,978,270 | A | 11/1999 | Tanaka et al. |
| 5,995,417 | A | 11/1999 | Chen et al. |
| 6,041,001 | A * | 3/2000 | Estakhri ................. 365/200 |
| 6,130,841 | A | 10/2000 | Tanaka et al. |
| 6,166,962 | A | 12/2000 | Chen et al. |
| 6,198,662 | B1 | 3/2001 | Chen et al. |
| 6,222,773 | B1 | 4/2001 | Tanzawa et al. |
| 6,249,459 | B1 | 6/2001 | Chen et al. |
| 6,353,556 | B2 | 3/2002 | Chen et al. |
| 6,381,174 | B1 | 4/2002 | Roohparvar et al. |
| 6,421,276 | B1 | 7/2002 | Goltman |
| 6,452,840 | B1 | 9/2002 | Sunkavalli et al. |
| 6,483,751 | B2 | 11/2002 | Chen et al. |
| 6,519,184 | B2 | 2/2003 | Tanaka et al. |
| 6,525,964 | B2 | 2/2003 | Tanaka et al. |
| 6,529,413 | B2 | 3/2003 | Lee et al. |
| 6,618,288 | B2 | 9/2003 | Akaogi et al. |
| 6,620,682 | B1 | 9/2003 | Lee et al. |
| 6,643,183 | B2 | 11/2003 | Atsumi et al. |
| 6,643,184 | B2 | 11/2003 | Pio |
| 6,643,188 | B2 | 11/2003 | Tanaka et al. |
| 6,646,920 | B2 | 11/2003 | Takashina et al. |
| 6,664,587 | B2 | 12/2003 | Guterman et al. |
| 6,704,222 | B2 | 3/2004 | Guterman et al. |
| 6,711,066 | B2 | 3/2004 | Tanzawa et al. |
| 6,744,670 | B2 | 6/2004 | Tamada et al. |
| 6,771,541 | B1 | 8/2004 | Park |
| 6,842,380 | B2 * | 1/2005 | Lakhani et al. ........ 365/185.29 |
| 6,859,397 | B2 | 2/2005 | Lutze et al. |
| 6,862,223 | B1 | 3/2005 | Lee et al. |
| 6,894,931 | B2 | 5/2005 | Yaegashi et al. |
| 7,009,889 | B2 | 3/2006 | Tran et al. |
| 7,057,936 | B2 | 6/2006 | Yaegashi et al. |
| 7,079,437 | B2 * | 7/2006 | Hazama et al. ............. 365/210 |
| 7,102,929 | B2 | 9/2006 | Lee et al. |
| 2002/0133679 | A1 | 9/2002 | Choi et al. |
| 2003/0123296 | A1 | 7/2003 | Hirano |
| 2003/0147278 | A1 | 8/2003 | Tanaka et al. |
| 2003/0189864 | A1 | 10/2003 | Sim |
| 2004/0141378 | A1 | 7/2004 | Tanzawa et al. |
| 2005/0041515 | A1 | 2/2005 | Futatsuyama et al. |
| 2005/0105373 | A1 | 5/2005 | Takase et al. |
| 2005/0128805 | A1 | 6/2005 | Lee et al. |
| 2006/0140012 | A1 | 6/2006 | Wan et al. |
| 2006/0221660 | A1 | 10/2006 | Hemink et al. |
| 2006/0221661 | A1 | 10/2006 | Hemink et al. |
| 2006/0221703 | A1 | 10/2006 | Higashitani |
| 2006/0221705 | A1 | 10/2006 | Hemink et al. |
| 2006/0279992 | A1 * | 12/2006 | Park et al. .............. 365/185.17 |
| 2006/0285387 | A1 * | 12/2006 | Micheloni et al. ...... 365/185.17 |

FOREIGN PATENT DOCUMENTS

| | | |
|---|---|---|
| WO | 2004013864 | 2/2004 |

OTHER PUBLICATIONS

Office Action, Non-Final, United States Patent & Trademark Office, U.S. Appl. No. 11/296,032 entitled, "Systems for Erasing Non-Volatile Memory Utilizing Changing Word Line Conditions to Compensate for Slower Erasing Memory Cells," Feb. 28, 2007.

Office Action, Non-Final, United States Patent & Trademark Office, U.S. Appl. No. 11/296,028 entitled, "Systems for Erasing Non-Volatile Memory Using Individual Verification and Additional Erasing Subsets of Memory Cells," Mar. 12, 2007.

Office Action, Election/Restrictions, United States Patent & Trademark Office, U.S. Appl. No. 11/296,032 entitled, "Systems for Erasing Non-Volatile Memory Utilizing Changing Word Line Conditions to Compensate for Slower Erasing Memory Cells," Nov. 8, 2006.

Office Action, Election/Restrictions, United States Patent & Trademark Office, U.S. Appl. No. 11/296,028 entitled, "Systems for Erasing Non-Volatile Memory Using Individual Verification and Additional Erasing Subsets of Memory Cells," Dec. 6, 2006.

Notice of Allowance and Fee(s) Due, United States Patent & Trademark Office, U.S. Appl. No. 11/296,071 entitled, "Systems for Soft Programing Non-Volatile Memory Using Individual Verification and Additional Erasing Subsets of Memory Cells," Dec. 5, 2006.

Notice of Allowance and Fee(s) Due, United States Patent & Trademark Office, U.S. Appl. No. 11/296,071 entitled, "Systems for Soft Programing Non-Volatile Memory Using Individual Verification and Additional Erasing Subsets of Memory Cells," Apr. 9, 2007.

International Preliminary Report on Patentability (Chapter 1 of the Patent Cooperation Treaty), Patent Cooperation Treaty, Application No. PCT/US2005/045557 filed on Dec. 15, 2005.

Non-final Office Action, United States Patent & Trademark Office, U.S. Appl. No. 11/296,055 filed on Dec. 6, 2005.

* cited by examiner

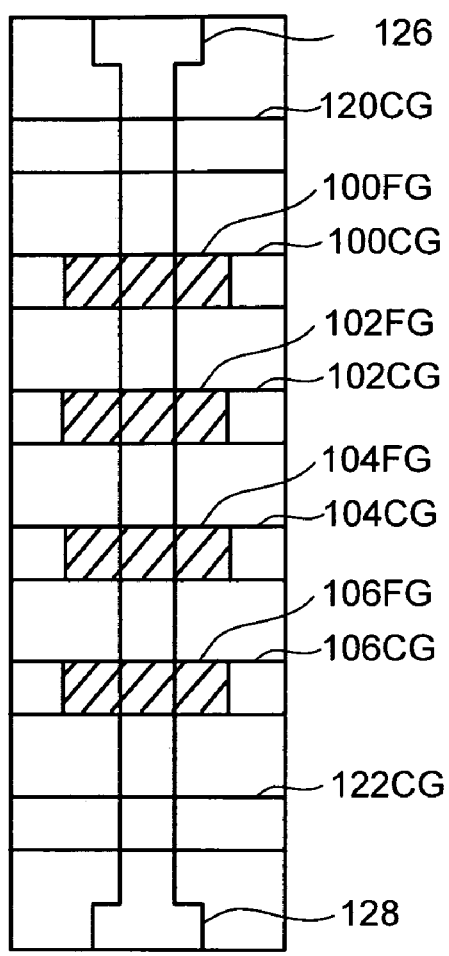
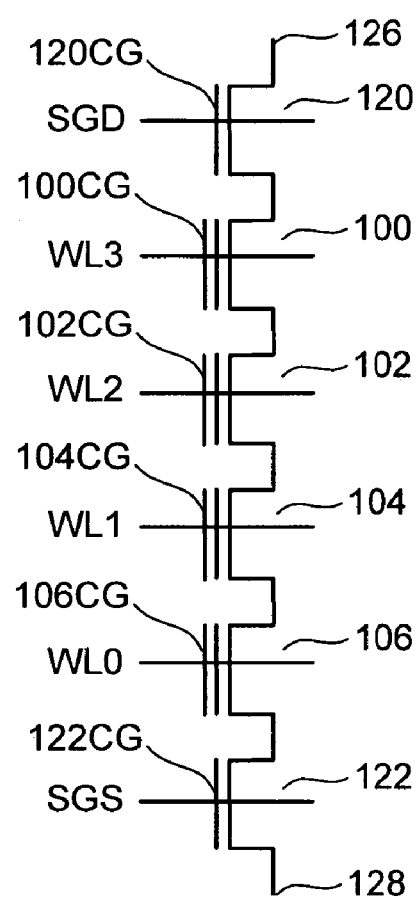

| Bit Line | Floating |
|---|---|
| SGD | Floating |
| WLn | 0V |
| WLn-1 | 0V |
| . | 0V |
| . | 0V |
| WLi | 0V |
| . | 0V |
| . | 0V |
| WL1 | 0V |
| WL0 | 0V |
| SGS | Floating |
| Source Line | Floating |
| P-well | Verase |

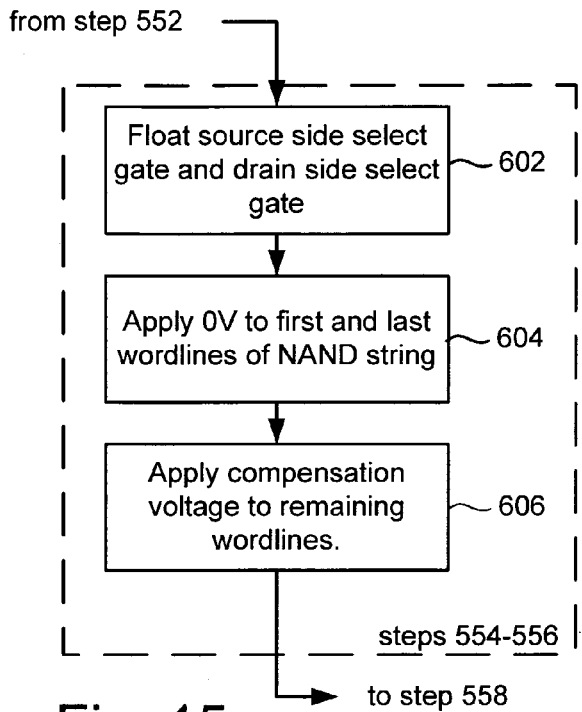
Fig. 15a
| Bit Line | Floating |
|---|---|
| SGD | Floating |
| WLn | 0V |
| WLn-1 | Vcomp1 |
| . | . |
| . | . |
| WLi | Vcomp1 |
| . | . |
| . | . |
| WL1 | Vcomp1 |
| WL0 | 0V |
| SGS | Floating |
| Source Line | Floating |
Fig. 15b
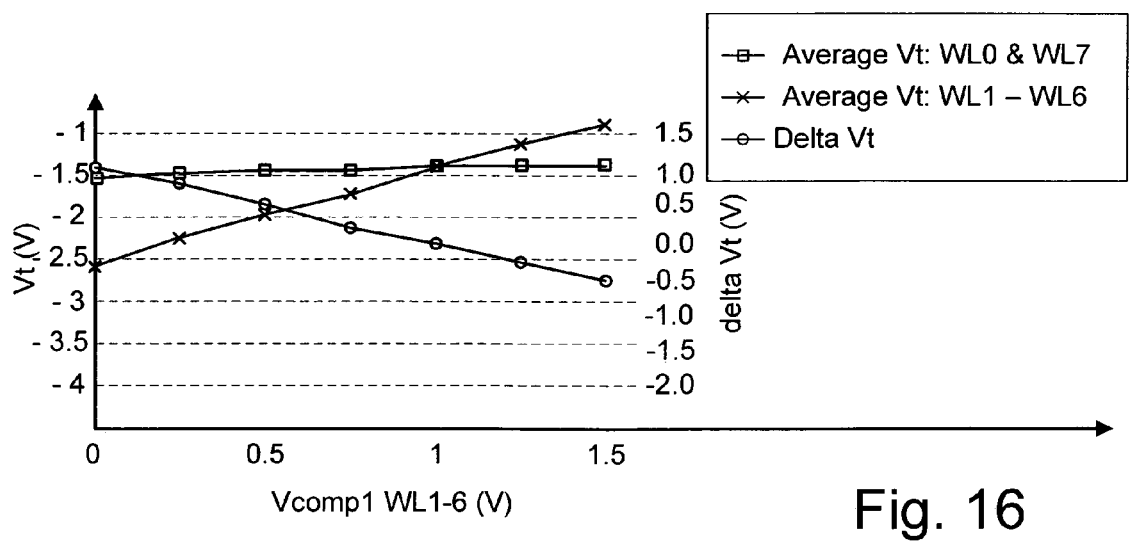
Fig. 16

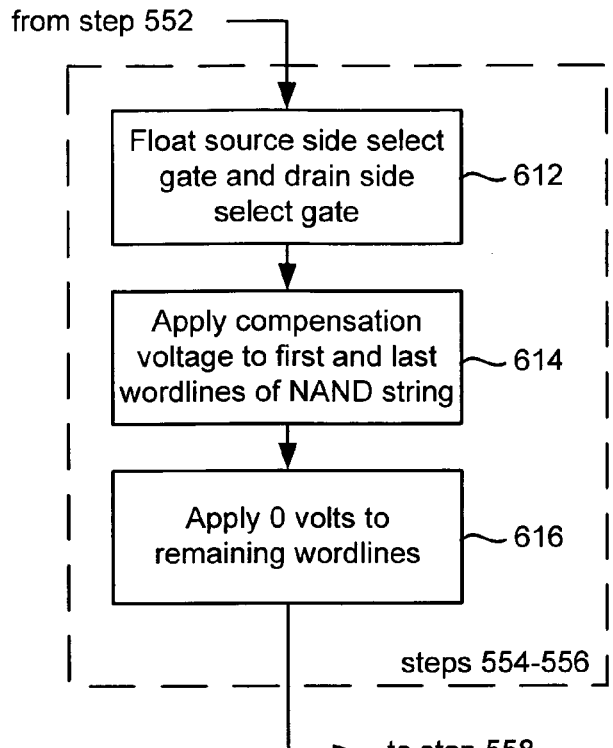
Fig. 17a
| Bit Line | Floating |
|---|---|
| SGD | Floating |
| WLn | Vcomp2 |
| WLn-1 | 0V |
| . | . |
| . | . |
| WLi | 0V |
| . | . |
| . | . |
| WL1 | 0V |
| WL0 | Vcomp2 |
| SGS | Floating |
| Source Line | Floating |
610
Fig. 17b
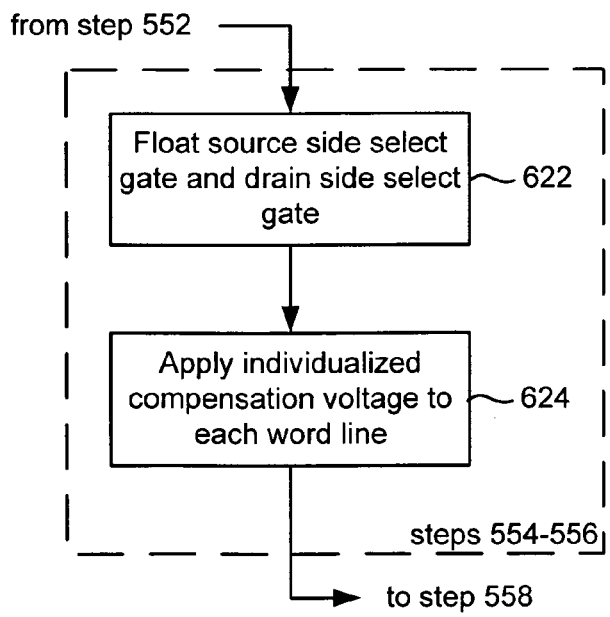
Fig. 18a
| Bit Line | Floating |
|---|---|
| SGD | Floating |
| WLn | Vcomp_n |
| WLn-1 | Vcomp_n-1 |
| . | . |
| . | . |
| WLi | Vcomp_i |
| . | . |
| . | . |
| WL1 | Vcomp_1 |
| WL0 | Vcomp_0 |
| SGS | Floating |
| Source Line | Floating |
620
Fig. 18b

| Bit Line | Floating |
|---|---|
| SGD | Vcomp4 |
| WLn | 0V |
| WLn-1 | 0V |
| . | . |
| . | . |
| WLi | 0V |
| . | . |
| . | . |
| WL1 | 0V |
| WL0 | 0V |
| SGS | Vcomp4 |
| Source Line | Floating |

WORD LINE COMPENSATION IN NON-VOLATILE MEMORY ERASE OPERATIONS

BACKGROUND OF THE INVENTION

1. Field of the Invention

The present invention relates generally to semiconductor technology for erasing non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG for select gate 120. Select gate 122 is controlled by applying the appropriate voltages to control gate 122CG of select gate 122. Each of the transistors 100, 102, 104 and 106 includes a control gate and a floating gate, forming the gate elements of a memory cell. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00."

Relevant examples of NAND type flash memories and their operation are provided in the following U.S. Patents/Patent Applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. patent application. Ser. No. 09/893,277 (Publication No. US2003/0002348).

When programming a flash memory cell, a program voltage is applied to the control gate (via a selected word line) and the bit line is grounded. Electrons from the p-well are injected into the floating gate. When electrons accumulate in the floating gate, the floating gate becomes negatively charged and the threshold voltage of the cell is raised. The floating gate charge and threshold voltage of the cell can be indicative of a particular state corresponding to stored data.

In order to erase memory cells of a NAND type flash memory, electrons are transferred from the floating gate of each memory cell to the well region and substrate. Typically, one or more high voltage (e.g., ~16V–20V) erase pulses are applied to the well region to attract electrons away from the floating gate of each memory cell to the well region. The word lines of each memory cell are grounded or supplied with 0V to create a high potential across the tunnel oxide region to attract the electrons. If each memory cell of a NAND string is not erased after application of an erase voltage pulse, the size of the pulse can be increased and reapplied to the NAND string until each memory cell is erased.

Typical erase operations using prior art techniques can lead to differing erase rates amongst memory cells in a NAND string. Some memory cells may reach a target threshold voltage level for an erased state faster or slower than others. This can lead to over-erasure of faster erasing memory cells because they will continue to be subjected to erase voltages that are applied to sufficiently erase the slower memory cells of the NAND string. Typical erase operations can also lead to disparate threshold voltages among memory cells of a NAND string. That is, one or more memory cells of the NAND string may have a different threshold voltage after application of one or more erase voltage pulses when compared to other memory cells of the string or device. To overcome this effect, soft-programming has been used to adjust the threshold voltages of one or more memory cells after erasure. For example, a small program voltage may be applied to one or more memory cells to raise their threshold voltages in order to narrow and/or raise the threshold voltage distribution of the population of erased memory cells. Soft-programming, however, may increase program and erase times. Moreover, the different erase rates can result in a shorter cycling life of a memory, string.

Accordingly, there is a need for a non-volatile memory system and related erase technique that can address the aforementioned problems of prior art erase techniques.

SUMMARY OF THE INVENTION

The present invention, roughly described, pertains to technology for erasing memory devices in a manner that provides a more efficient and consistent erasure of memory cells. In accordance with one embodiment, a system and method is provided that considers the individual characteristics and erase behavior of one or more memory cells of a NAND string during erase operations.

One or more compensation voltages can be applied to one or more portions of a NAND string in accordance with one embodiment to at least partially normalize the erase behavior of one or more memory cells of the NAND string during an erase operation. A compensation voltage can cause the erasure rate and/or amount to which a memory cell is erased after application of one or more erase voltage pulses to be made substantially equal to that of other memory cells in the NAND string.

The amount of charge transferred from a floating gate of a memory cell after application of an erase voltage pulse and consequently, the time required to erase the memory cell can be affected by capacitively coupled voltages in a NAND string. For example, the end memory cells of a NAND string (e.g., memory cells 222 and 228 of NAND string 202 in FIG. 3) can have the net charge at their respective floating gates raised by a voltage coupled from the adjacent select gates. This raised voltage can in turn decrease the effective potential across the tunnel oxide layer of the memory cell when a high potential erase voltage pulse is applied at the well region of the string. Because the potential across the tunnel oxide layer at the end memory cells is lower than that of other memory cells, they will erase slower or to a less degree than other memory cells of the string. Additional voltages capacitively coupled amongst other memory cells can also cause disparate erase behavior and times among other memory cells in the NAND string. Various compensation voltages can be applied at various portions of the NAND string to compensate for one or more of these capacitively coupled voltages during erase operations.

In one embodiment, a method of erasing non-volatile storage is provided that comprises applying at least one compensation voltage to a portion of a string of non-volatile storage elements to at least partially compensate for a voltage coupled to one or more non-volatile storage elements of the string from at least one transistor of the string and transferring charge from a floating gate of at least a subset of non-volatile storage elements of the string while applying the at least one compensation voltage in order to erase the string of non-volatile storage elements. The compensation voltage can compensate for faster or slower erasing memory cells. In one embodiment, applying a compensation voltage can include applying a first voltage to a control gate of a first non-volatile storage element of the string and applying a second voltage to a control gate of a second non-volatile storage element of the string. By applying a compensation voltage to a first and second non-volatile storage element, the potential across the tunnel oxide layer of each storage element during application of an erase voltage pulse can be equalized.

In one embodiment, a negative compensation voltage is applied to one or more end memory cells of a NAND string to at least partially compensate for a positive voltage coupled to the cells from an adjacent select gate. The negative voltage can offset the positive capacitively coupled voltage from the select gate, allow a higher potential to be created across the tunnel oxide layer of the cell when an erase voltage is applied, and increase the erase rate of the affected memory cell.

In another embodiment, a positive compensation voltage is applied to one or more interior memory cells of a NAND string to at least partially compensate for a voltage coupled to one or more memory cells of the string. A positive compensation voltage applied to an interior memory cell can decrease the potential across the cell's tunnel oxide layer when an erase voltage is applied and thereby decrease the erase rate of the cell to substantially match that of other memory cells of the NAND string.

In one embodiment, applying a compensation voltage can include applying one or more compensation voltages to each memory cell of the NAND string to at least partially compensate for a voltage coupled to each memory cell from one or more neighboring transistors. In one embodiment, a value of a compensation voltage to be applied to a memory cell can be selected by comparing the erase behavior of the selected memory cell with a reference memory cell.

In one embodiment, a compensation voltage can be applied to one or more select gates of a NAND string to at least partially compensate for a voltage coupled to an adjacent memory cell from the select gate. A voltage less than the erase voltage pulse can be applied to the select gate such that a portion of the lesser applied voltage will couple to the neighboring memory cell instead of the greater erase voltage.

In accordance with one embodiment, a non-volatile memory system is provided that includes a string of non-volatile storage elements. The system further includes a managing circuit in communication with the string of non-volatile storage. While erasing the cells in the string of non-volatile storage, the managing circuit applies at least one compensation voltage to a portion of the string to at least partially compensate for a voltage coupled to one or more non-volatile storage elements of the plurality from at least one transistor of the string while charge is transferred from a floating gate of at least a subset of the plurality of non-volatile storage elements.

A system in accordance with an embodiment can include an array of storage elements and a managing circuit. The managing circuit can include dedicated hardware and/or can include hardware that is programmed by software stored on one or more storage devices such as non-volatile memory (e.g. flash memory, EEPROM, etc.) or other memory devices. In one embodiment, the managing circuit includes a controller and a state machine. In another embodiment, the managing circuit only includes a state machine and not a controller. The managing circuit can perform the techniques discussed above with respect to various embodiments. Methods in accordance with some embodiments are performed by the state machine. In some implementations, the state machine is on the same integrated circuit chip as the array of storage elements.

Other features, aspects, and objects of the invention can be obtained from a review of the specification, the figures, and the claims.

BRIEF DESCRIPTION OF THE DRAWINGS

FIG. 1 is a top view of a NAND string.

FIG. 2 is an equivalent circuit diagram of the NAND string depicted in FIG. 1.

FIG. 15a is a flowchart depicting a method of applying erase bias conditions and one or more compensation voltages in accordance with one embodiment.

FIG. 15b is a table including erase bias conditions and compensation voltages in accordance with one embodiment.

FIG. 16 is a graph depicting exemplary average threshold voltages of select memory cells of a NAND string after erasure wherein various compensation voltages according to one embodiment are applied during the erase operation.

FIG. 17a is a flowchart depicting a method of applying erase bias conditions and one or more compensation voltages in accordance with one embodiment.

FIG. 17b is a table including erase bias conditions and compensation voltages in accordance with one embodiment.

FIG. 18a is a flowchart depicting a method of applying erase bias conditions and one or more compensation voltages in accordance with one embodiment.

FIG. 18b is a table including erase bias conditions and compensation voltages in accordance with one embodiment.

DETAILED DESCRIPTION

Figure 4:
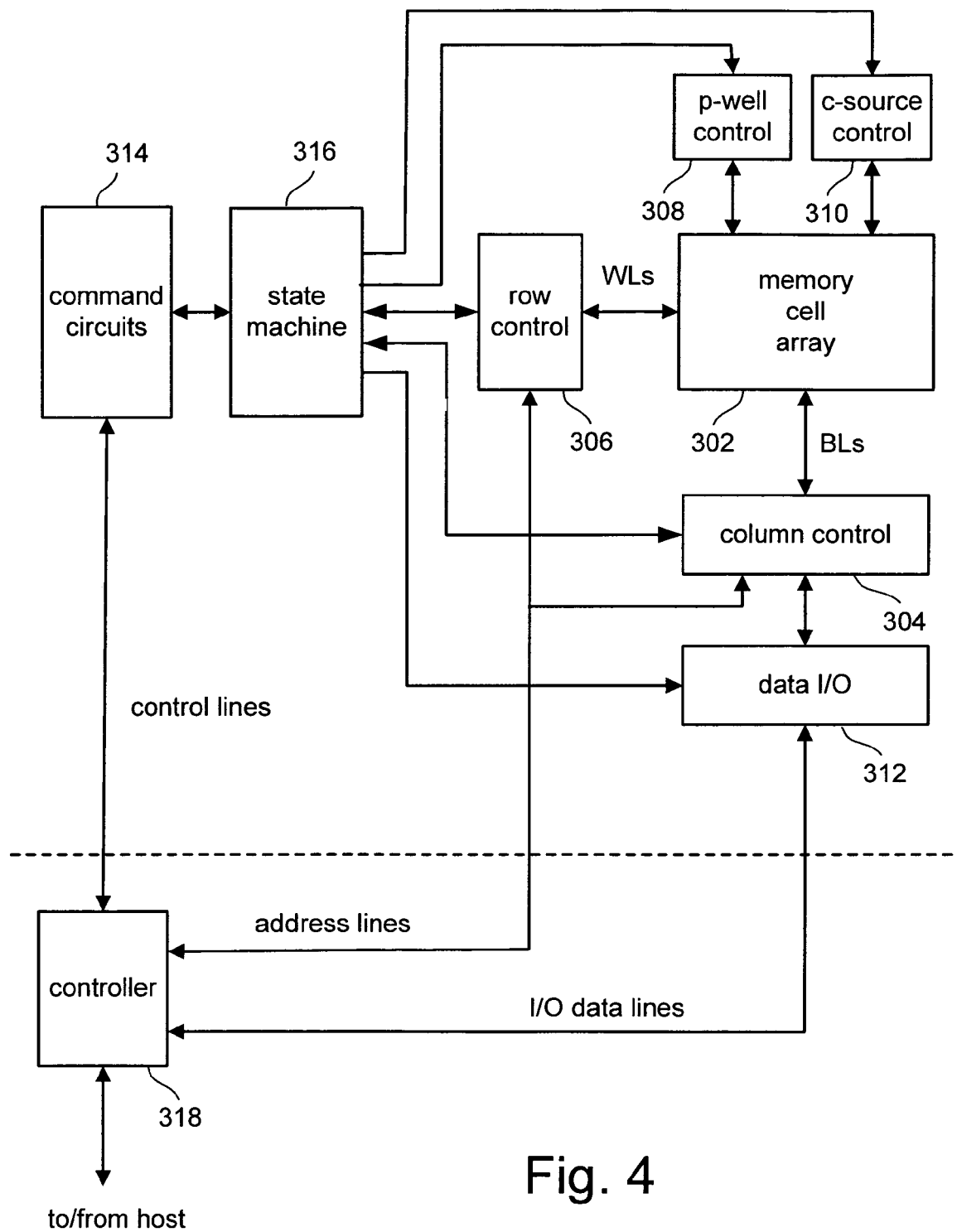
FIG. 4 is a block diagram of one embodiment of a non-volatile memory system in which the various aspects of the present invention can be implemented.

FIG. 4 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which is in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 5:
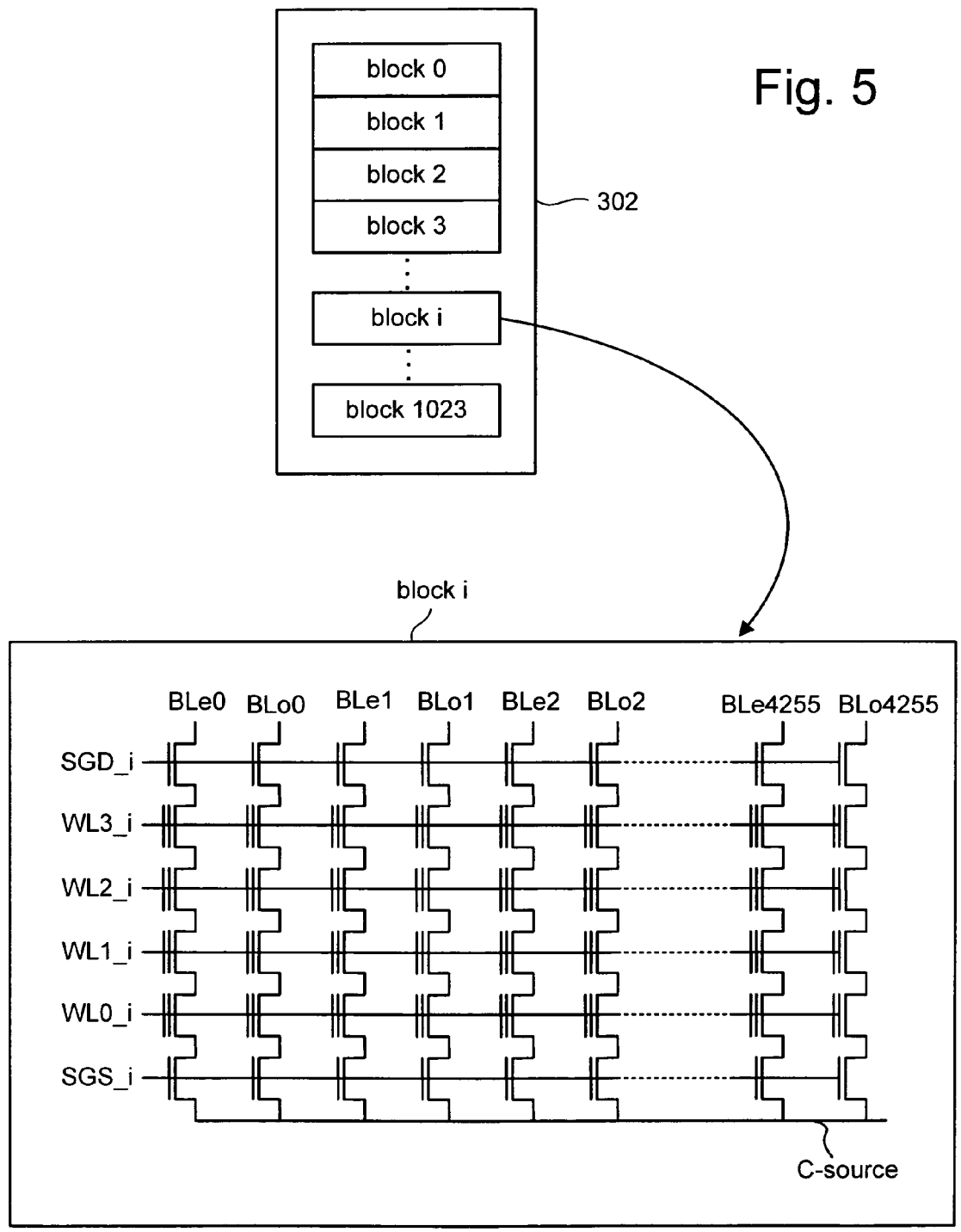
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns. The bit lines are divided into even bit lines (BLe) and odd bit lines (BLo). FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 2.4V, for example, so that as programming progresses it is verified whether or not the threshold voltage has reached 2.4V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0 volts while the control gate receives a series of programming pulses with increasing magnitudes. In one embodiment, the magnitudes of the pulses in the series range from 7 volts to 20 volts. In other embodiments, the range of pulses in the series can be different, for example, having a starting level of higher than 7 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 6:
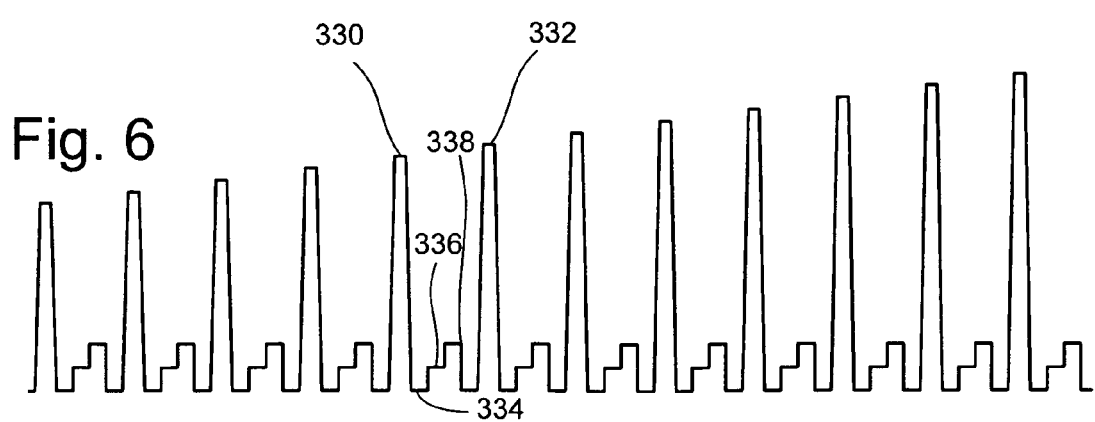
FIG. 6 depicts an exemplary program/verify voltage signal that can be applied to a selected word line in accordance with embodiments.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations for seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in U.S. patent application Ser. No. 10/314,055, entitled "Smart Verify for Multi-State Memories," filed Dec. 5, 2002, incorporated herein by reference in its entirety.

The read and verify operations described above are performed according to techniques known in the art. Thus, many of the details explained can be varied by one skilled in the art.

Figure 7:
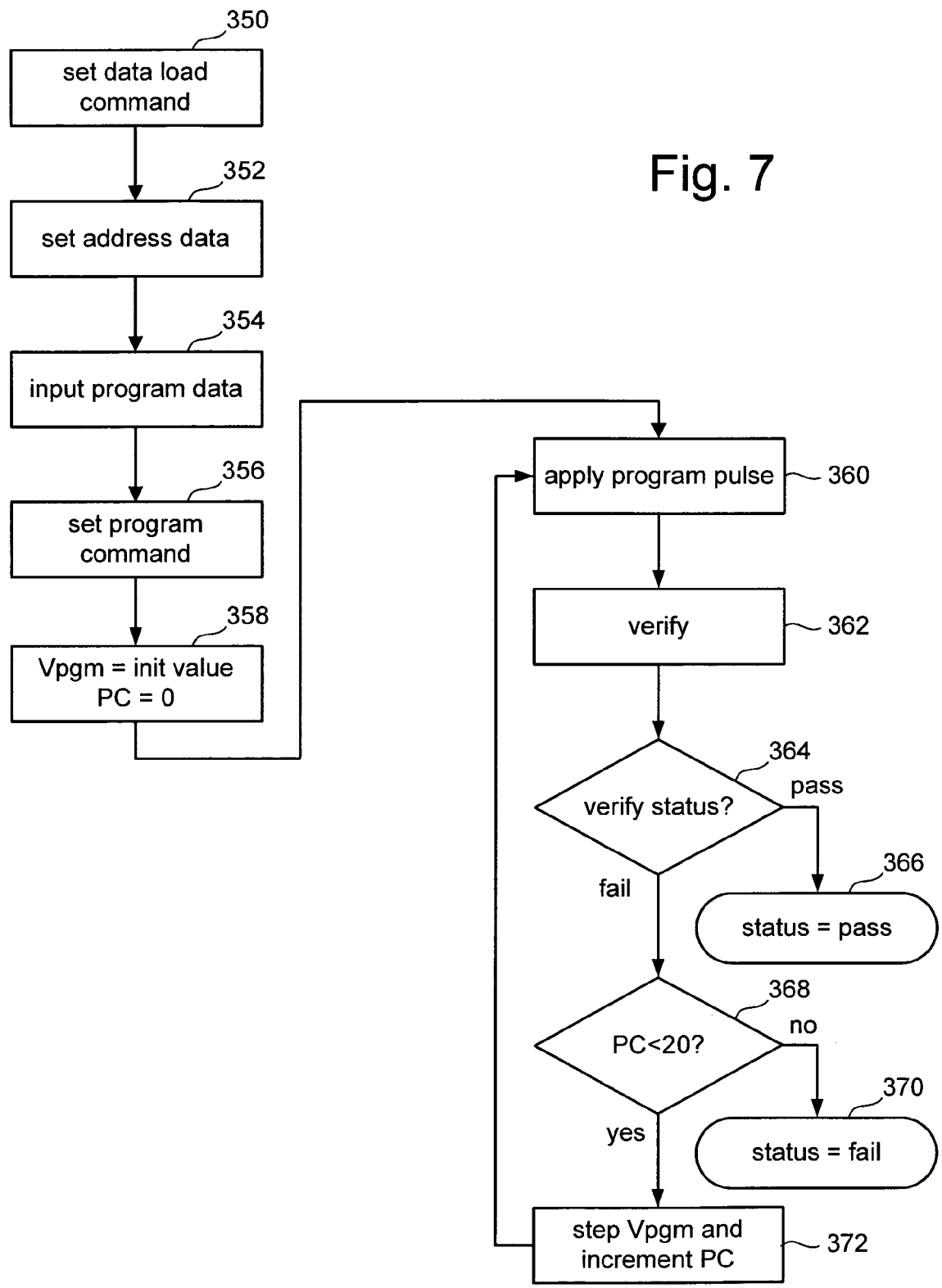
FIG. 7 is an exemplary flowchart for performing a program operation.

FIG. 7 is a flowchart describing a method for programming a non-volatile memory system. As will be apparent to those of ordinary skill in the art, various steps can be modified, added, or removed depending on a specific application or implementation while still remaining within the scope and spirit of the present disclosure. In various implementations, memory cells are erased (in blocks or other units) prior to programming. At step 350 of FIG. 7 (and in reference to FIG. 4), a data load command is issued by controller 318 and input to command circuit 314, allowing data to be input to data input/output buffer 312. The input data is recognized as a command and latched by state machine 316 via a command latch signal, not illustrated, input to command circuits 314. In step 352, address data designating the page address is input to row controller 306 from controller 318. The input data is recognized as the page address and latched via state machine 316, effected by the address latch signal input to command circuits 314. At step 354, 532 bytes of program data are input to data input/output buffer 312. It should be noted that 532 bytes of program data are specific to the particular implementation described, and other implementations will require or utilize various other sizes of program data. That data can be latched in a register for the selected bit lines. In some embodiments, the data is also latched in a second register for the selected bit lines to be used for verify operations. At step 356, a program command is issued by controller 318 and input to data input/output buffer 312. The command is latched by state machine 316 via the command latch signal input to command circuits 314

At step 358, Vpgm, the programming pulse voltage level applied to the selected word line, is initialized to the starting pulse (e.g. 12 volts), and a program counter PC maintained by state machine 316, is initialized at 0. At step 360, a program voltage (Vpgm) pulse is applied to the selected word line, for example WL2 of FIG. 3. The bit lines that include a memory cell to be programmed are grounded to enable programming, while the other bit lines are connected to Vdd to inhibit programming during application of the programming pulse.

At step 362, the states of the selected memory cells are verified. If it is detected that the target threshold voltage of a selected cell has reached the appropriate level (for example, the programmed level for logic 0 or a particular state of a multi-state cell), then the selected cell is verified as programmed to its target state. If it is detected that the threshold voltage has not reached the appropriate level, the selected cell is not verified as programmed to its target state. Those cells verified as programmed to their target state at step 362 will be excluded from further programming. At step 364, it is determined whether all cells to be programmed have been verified to have programmed to their corresponding states, such as by checking an appropriate data storage register designed to detect and signal such a status. If so, the programming process is complete and successful because all selected memory cells were programmed and verified to their target states. A status of pass is reported in step 366. If at step 364, it is determined that not all of the memory cells have been so verified, then the programming process continues. At step 368, the program counter PC is checked against a program limit value. One example of a program limit value is 20. If the program counter PC is not less than 20, then the program process is flagged as failed and a status of fail is reported at step 370. If the program counter PC is less than 20, then the Vpgm level is increased by the step size and the program counter PC is incremented at step 372. After step 372, the process loops back to step 360 to apply the next Vpgm program pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 360–372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8:
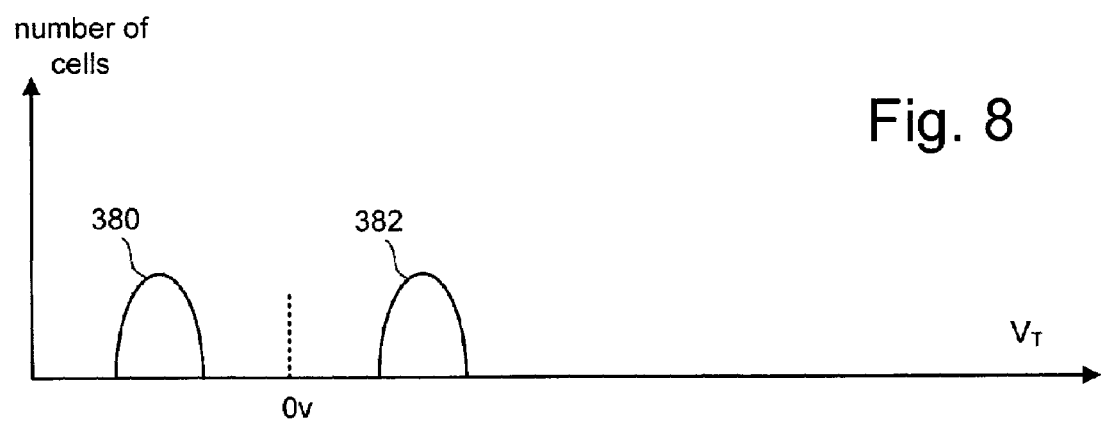
FIG. 8 depicts exemplary threshold distributions of a group of memory cells.

At the end of a successful program process, the threshold voltages of the memory cells should be within one or more distributions of threshold voltages for programmed memory cells or within a distribution of threshold voltages for erased memory cells. FIG. 8 illustrates threshold voltage distributions for a memory cell array when each memory cell stores one bit of data. FIG. 8 shows a first distribution 380 of threshold voltages for erased memory cells and a second distribution 382 of threshold voltages for programmed memory cells. In one embodiment, the threshold voltage levels in the first distribution 380 are negative and correspond to logic "1" while the threshold voltage levels in the second distribution 382 are positive and correspond to logic "0."

Figure 9:
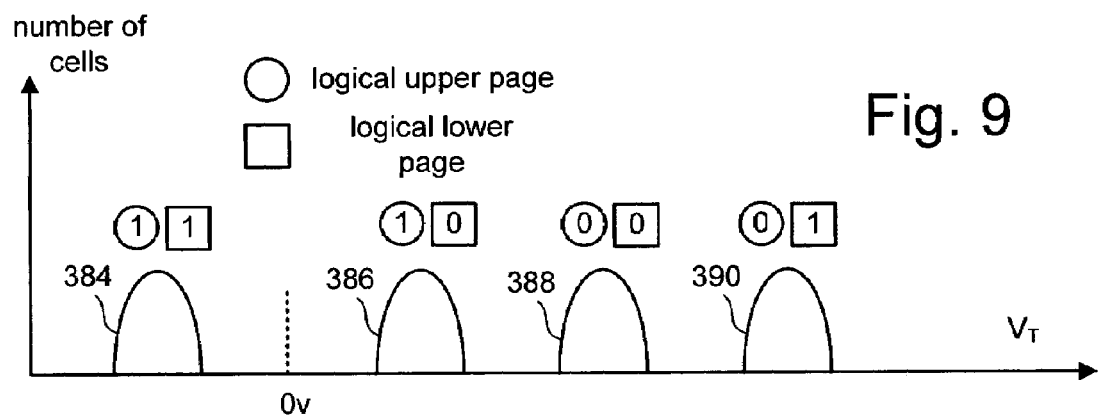
FIG. 9 depicts exemplary threshold distributions of a group of memory cells storing two bits of data.

FIG. 9 illustrates exemplary threshold voltage distributions for a memory cell array when each memory cell stores two bits of data in four physical states. Distribution 384 represents a distribution of threshold voltages of cells that are in an erased state (storing "11"), having negative threshold voltage levels. Distribution 386 represents a distribution of threshold voltages of cells that are in a first programmed state, storing "10." Distribution 388 represents a distribution of threshold voltages of cells that are in a second programmed state, storing "00." Distribution 390 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be so assigned, in which case the states between which programming occurs can be different than those depicted in FIGS. 8–9.

Figure 3:
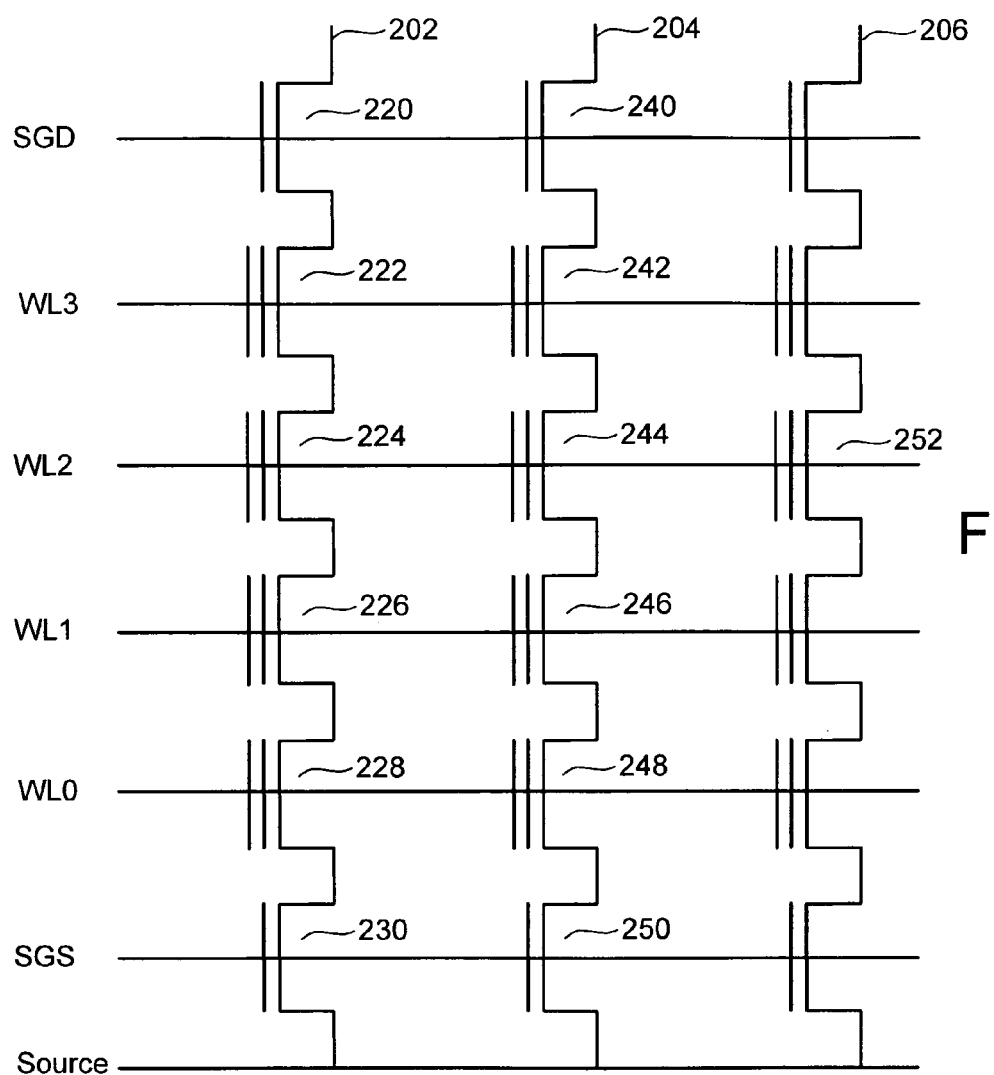
FIG. 3 is a circuit diagram depicting three NAND strings.

Normally, the cells being programmed in parallel are alternate ones along a word line. For example, FIG. 3 illustrates three memory cells 224, 244 and 252 of a much larger number of cells along one word line WL2. One set of alternate cells, including cells 224 and 252, store bits from logical pages 0 and 2 ("even pages"), while another set of alternate cells, including the cell 244, store bits from logical pages 1 and 3 ("odd pages").

Figures 10, 11:
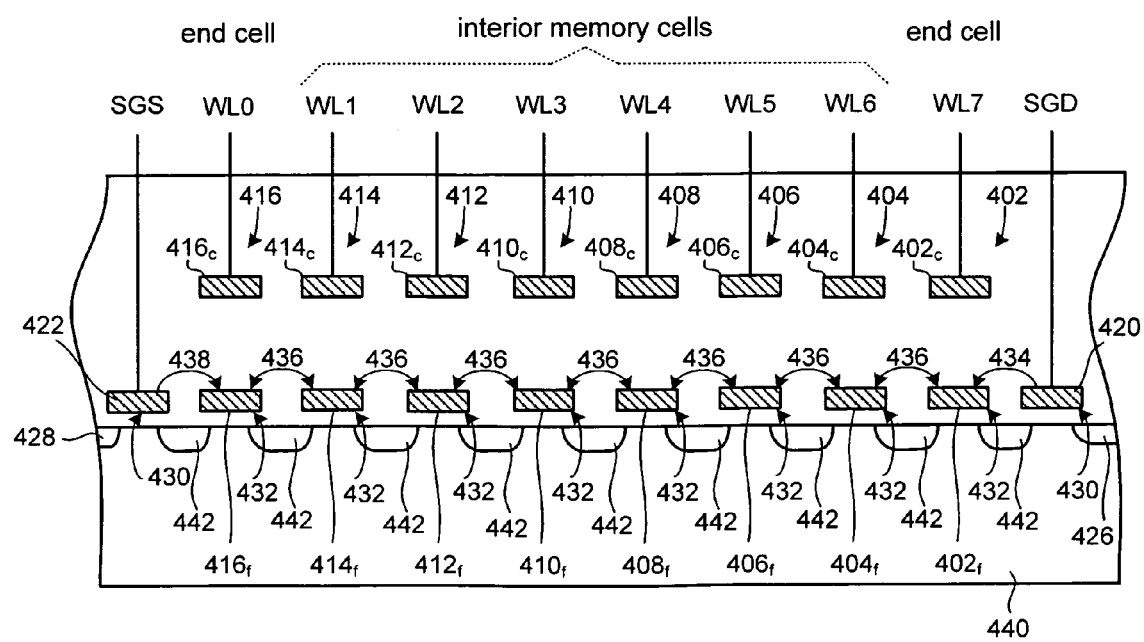
FIG. 10 is a table depicting exemplary bias conditions for performing an erase operation according to prior art techniques.
FIG. 11 is a cross sectional view of a NAND string depicting various capacitively coupled voltages within the NAND string.

Memory cells are erased in one embodiment by raising the p-well to an erase voltage (e.g. 20 volts) and grounding or applying 0 volts to the word lines of a selected block while the source and bit lines are floating, as set forth in the table of FIG. 10 which illustrates exemplary bias conditions for performing an erase operation. Due to capacitive coupling, the unselected word lines (e.g., those in unselected, not to-be-erased blocks), bit lines, select lines, and c-source are also raised to a high positive potential (e.g., 20V). A strong electric field is thus applied to the tunnel oxide layers of memory cells of a selected block and the data of the selected memory cells is erased as electrons of the floating gates are emitted to the substrate. As sufficient electrons are transferred from the floating gate to the p-well region, the threshold voltage of a selected cell becomes negative. Erasing can be performed on the entire memory array, one or more blocks of the array, or another unit of cells.

FIG. 11 provides a cross-sectional view of a NAND string including 8 memory cells. Although embodiments are presented with respect to FIG. 11 and an 8 cell NAND structure, the present invention is not so limited and can be used in accordance with numerous NAND structures including fewer or more than 8 memory cells (e.g., 4, 12, 16, or more). As depicted in FIG. 11, the transistors (also called cells or memory cells) of the NAND string are formed in p-well region 440. Each transistor (402, 404, 406, 408, 410, 412, and 414) includes a stacked gate structure that consists of the control gate (402*c*, 404*c*, 406*c*, 408*c*, 410*c*, 412*c*, 414*c*) and a floating gate (402*f*, 404*f*, 406*f*, 410*f*, 412*f*, and 414*f*). The floating gates are formed on the surface of the p-well on top of an oxide or other dielectric composite film. The control gate is above the floating gate, with an oxide or other isolating dielectric layer separating the control gate and floating gate. The control gates of the memory cells connect to or form word lines WL0, WL1, WL2, WL3, WL4, WL5, WL6, and WL7. N+ diffused regions 442 are shared between neighboring cells whereby the cells are connected to one another in series to form a NAND string. These N+ diffused regions form the source and drain of each of the cells. N+ diffused region 426 connects to the bit line for the NAND string, while N+ diffused region 428 connects to a common source line for multiple NAND strings.

Because of capacitive coupling, the select gates SGD and SGS are raised to a high positive potential when a high erase voltage is applied to the p-well during erase operations. The erase voltage applied to the p-well, or some portion thereof, couples from the well region to each of the select gates. For example, in many non-volatile memory systems including a NAND structure about 100% of the p-well voltage will couple to each of the select gates. Therefore, if an erase voltage pulse of 20V is applied to the p-well, about 19V–20V will couple to the control gates of each select gate. In FIG. 11, the voltage coupling from the p-well to the select gates is illustrated by arrows 430. Although to a lesser degree, a similar coupling effect is also experienced by each of the memory cells of the string. About 50% of the p-well voltage will couple to each of the memory cells in a typical NAND string. Thus, the floating gates of each memory cell will be raised to a potential of about 10V under application of a 20V erase voltage pulse due to capacitive coupling. This coupling effect is illustrated by arrows 432. Because the potential across the tunnel oxide is equal to the difference between the applied erase voltage and the voltage on the floating gate, the voltage coupled to each of the memory cells reduces the potential of the electric field produced across the tunnel oxide layer. For example, a potential of only about 10V (20V–10V) under application of a 20V erase voltage pulse will be present across the tunnel oxide layers of the memory cells to attract electrons from each floating gate to the substrate.

In addition to the heretofore described capacitive coupling of the erase voltage applied to the p-well, each memory cell of the string will experience some capacitive coupling from neighboring memory cells and/or transistors. The end memory cells (e.g., memory cells 402 and 416 in FIG. 11) of the NAND string, that is, those connected to the first and last word lines (end word lines) of the NAND string and adjacent to the select gates of the NAND string, will experience capacitive coupling of a potential from the neighboring select gates. In FIG. 11, this capacitive coupling is depicted by arrow 434 from select gate 420 to floating gate 402f of the memory cell at WL7 and by arrow 438 depicting the coupling from select gate 422 to floating gate 416f of the memory cell at WL0. The voltage coupled to memory cells 402 and 416 will decrease the electric field present across those cell's tunnel dielectric (e.g., tunnel oxide) in proportion to the amount of voltage at the respective select gate. In many NAND implementations, capacitive coupling from the select gates to the end memory cells of a NAND string can be expected to be on the order of about 5% to 10%. Thus, if an erase voltage of 20 volts is applied to the p-well region and about 50% of this voltage couples to the select gates (resulting in a charge of about 10 volts at the select gate), about a 0.5 volts to 1 volt will couple to the floating gates of the adjacent memory cells (e.g. 416f and 402f). Thus, the electrical field across the tunnel oxide of the end memory cells of the string will be about a 0.5 volts to 1 volt less than that for the remaining memory cells of the string. The memory cells of a NAND string that are not adjacent to a select gate (i.e., all but the end memory cells of a NAND string) may be referred to herein as interior memory cells of the string. In FIG. 11, the interior memory cells of the NAND string are memory cells 404, 406, 408, 410, 412, and 414.

Because the electrical field across the tunnel oxide of the memory cells of the end word lines of a string is less than that of the interior memory cells, the end memory cells will erase slower (or to a lesser degree under application of an erase voltage pulse) than the interior memory cells. As set forth earlier, a potential of about 10 volts will exist across the tunnel oxide layers of the interior memory cells of the string under application of a 20 volt erase voltage and assuming a 50% capacitive coupling effect from the well region to the floating gates. Because of the 0.5 volts to 1 volt coupling from the neighboring select gates, the memory cells of word lines 0 and 7 will only have a net potential across their respective tunnel oxide layers of about 9 to 9.5 volts (20 volts minus 10.5 to 11 volts).

Because of the lower potential across the tunnel oxide layers of the end memory cells of a string, the end memory cells will not be as erased (will have fewer electrons transferred from their floating gates) as the interior memory cells after application of one or more erase voltage pulses.

Memory cells of a NAND string are verified as erased when the net charge stored on the floating gate is below a predetermined level. Because of the additional coupling to the floating gates of the end memory cells of the NAND string, the overall time for an erase operation is increased in order to sufficiently erase these end memory cells. For example, the interior memory cells of a NAND string may be sufficiently erased after application of a number N erase voltage pulses, while the end memory cells of the NAND string may not be sufficiently erased until application of N+1 or more erase voltage pulses. This differing erase behavior of interior memory cells compared to end memory cells is illustrated in FIG. 12.

Figure 12:
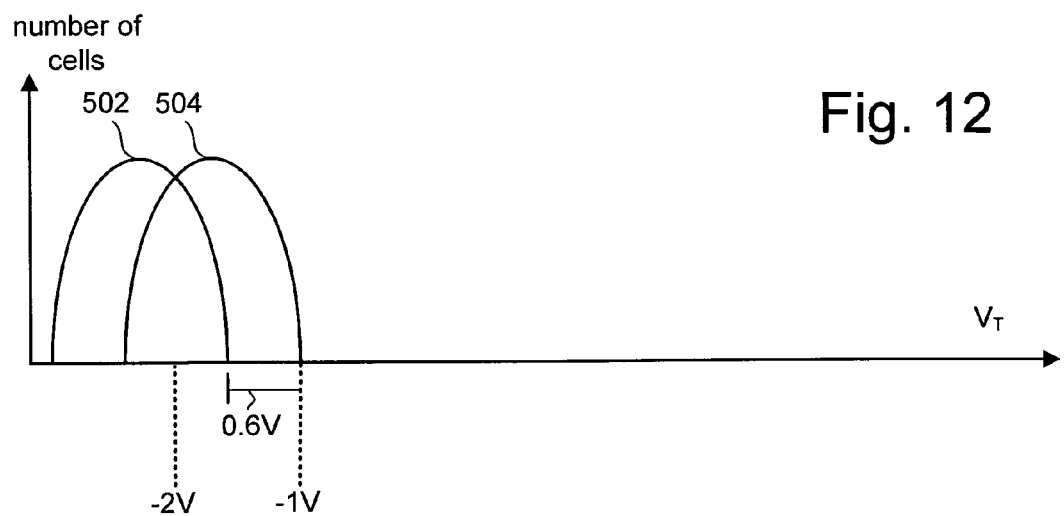
FIG. 12 depicts exemplary threshold voltage distributions of select memory cells of a NAND string after receiving an erase voltage pulse according to prior art techniques.

FIG. 12 depicts threshold voltage distributions after application of a single erase voltage pulse (a similar distribution with lower overall $V_T$ values will exist after multiple erase voltage pulses). Distribution 502 depicts the threshold voltage distribution for the interior memory cells of a NAND string, such as the memory cells connected to WL1–WL6 in FIG. 11. Distribution 504 depicts the threshold voltage distribution for the end memory cells, such as those connected to WL0 and WL7 in FIG. 11. As illustrated, those memory cells connected to the interior word lines are more erased than the memory cells of the end word lines of the NAND string after application of just one erase voltage pulse. On average, the interior memory cells are about 0.6 volts more erased than the end memory cells in the example shown. The average threshold voltage of the interior memory cells is lower than that of the end word lines because the number of electrons transferred from the floating gates of those memory cells is more than that of the memory cells connected to the end word lines.

Figure 13:
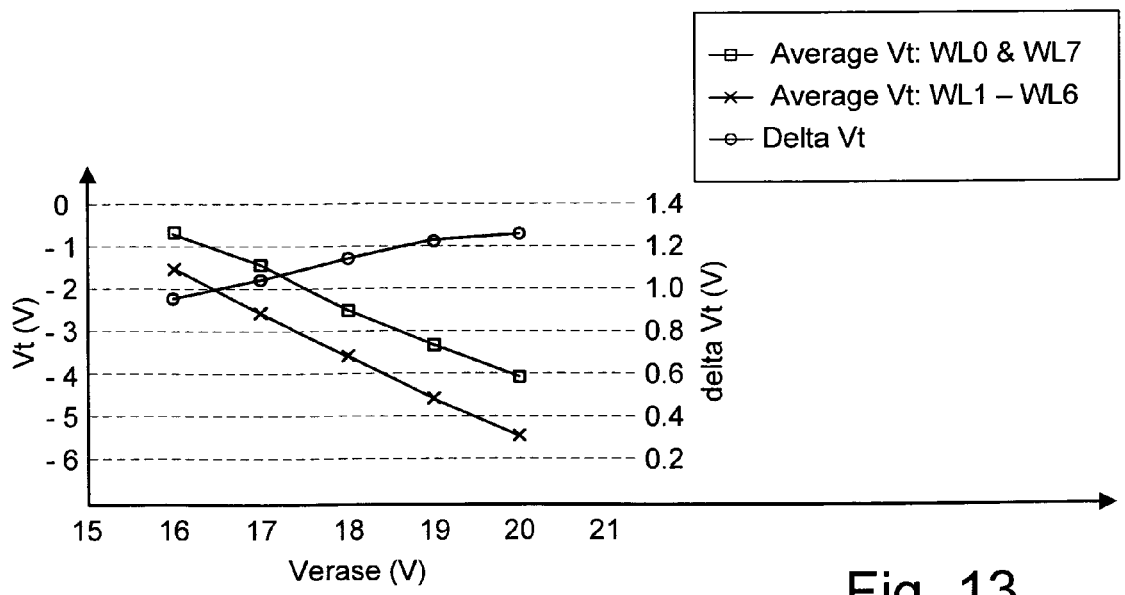
FIG. 13 is a graph depicting average threshold voltages of select memory cells of a NAND string as a function of an applied erase voltage pulse magnitude.

FIG. 13 is a graph depicting the average threshold voltage of the memory cells of a NAND string (e.g., the NAND string of FIG. 10) as a function of an applied erase voltage. After application of a 16 volt erase voltage pulse the average threshold voltage of a memory cell connected to WL0 or WL7 is almost −1 volt. The average threshold voltage of the interior memory cells of the NAND string, those memory cells connected to WL1–WL6, is about −1.5 volts. After application of a second erase voltage pulse, the average threshold voltage for WL0 and WL7 has decreased to about −1.5 volts while the average threshold voltage of the memory cells connected to WL1–WL6 is about −2.8 volts. After application of additional erase voltage pulses, the difference between the average threshold voltage of the interior memory cells and the end memory cells increases. This effect is illustrated by the third line in FIG. 13 which depicts the difference in average threshold voltage between the interior memory cells and the end memory cells after each erase voltage pulse.

When verification of erasure of a number of memory cells is performed at a NAND string level or higher (e.g., on a block or other unit of strings), disparate erase times or behavior amongst memory cells can lead to over stressing and over erasing certain memory cells. For example, the interior memory cells of a NAND string may be over erased while attempting to sufficiently erase the end memory cells of the string. As previously described, the interior memory cells will erase faster than the end memory cells (more electrons will be transferred from their floating gates under application of one or more erase voltage pulses). If verification is performed at a NAND string level, the NAND string will continue to receive an erase voltage pulse at the p-well until each memory cell of the string is erased. Therefore, even though the interior memory cells may sufficiently erase after a lower number of erase voltage pulses than the end memory cells, the interior memory cells will receive additional erase voltage pulses until each memory cell of the string is verified as erased.

A greater stress is placed on the interior memory cells than is necessary because of over erasure. Over erasing the interior memory cells because of the slower erase times of the end memory cells can decrease the life span of the interior memory cells and an overall non-volatile memory system. As understood in the art, application of a large potential across the tunnel oxide layer of a transistor stresses the oxide material. Application of a high enough potential across the tunnel oxide layer or application of a lower potential a number of times can eventually lead to a breakdown of the oxide layer.

Disparate erase behavior between memory cells can also lead to increased erase operation times because of additional operations that may be performed to change the threshold voltage of a memory cell after being erased. When flash memory cells are erased, the goal is that all erased cells have a negative threshold voltage within a predefined range of negative threshold voltages. As illustrated, however, the erase process may result in some cells having negative threshold voltages below the predefined range. Memory cells having a threshold voltage that is too low may not subsequently program properly. Thus, over-erased devices will often undergo what is called soft programming. Memory cells with threshold voltages of significantly lower values within the predefined range will receive a small amount of programming so that the threshold voltage is raised to be within the predefined range. The soft program process requires an additional operation to be performed and decreases memory performance due to increased erase times. In accordance with embodiments utilizing one or more compensation voltages as presently described, soft programming can be reduced or eliminated altogether from the erase process. Eliminating or reducing soft programming will increase memory performance.

In accordance with one embodiment, one or more compensation voltages are applied at one or more locations or portions of a NAND string during an erase operation in order to compensate for voltages capacitively coupled to the floating gates of one or more memory cells of the string. For example, one or more compensation voltages can be applied to a portion of the NAND string in order to compensate for an additional voltage coupled to the end memory cells of the NAND string from adjacent select gates.

Figure 14:
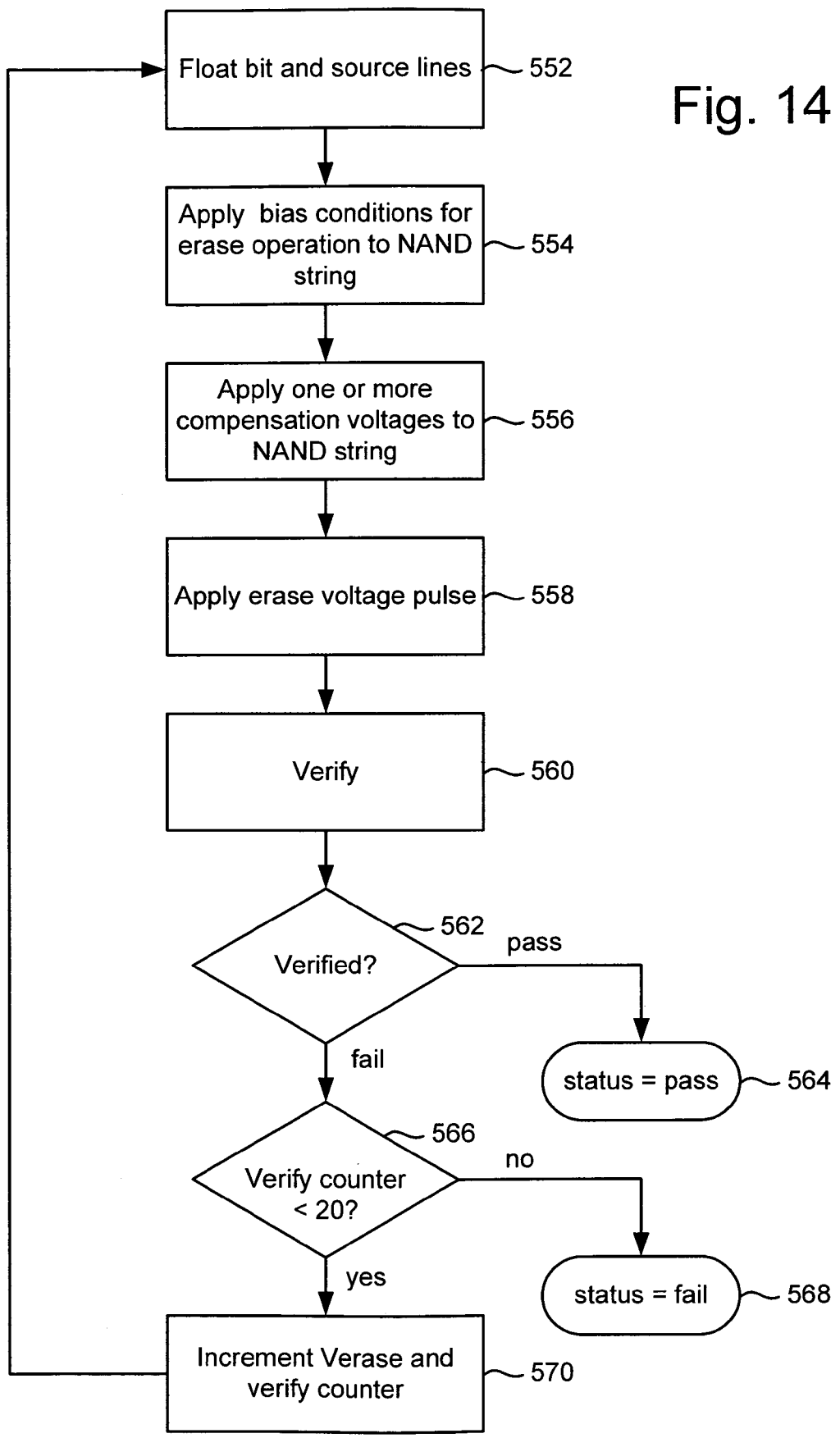
FIG. 14 is a flowchart depicting a method of erasing non-volatile storage in accordance with one embodiment.

FIG. 14 is a flowchart in accordance with one embodiment for performing an erase operation on a unit of memory cells including one or more NAND strings. Although FIG. 14 will be described in terms of a single NAND string, it will be understood by one of ordinary skill in the art that operation of the flowchart can be performed, such as in parallel, on multiple NAND strings in order to erase a larger unit of memory cells such as one or more blocks. Operation of the flowchart of FIG. 14 will be described in conjunction with the NAND string depicted in FIG. 11 for exemplary purposes, however the flowchart is not limited to a NAND string as depicted in FIG. 11 and can be used with other NAND strings or other serially connected cell structures including any number of memory cells.

At step 552 the bit and source lines of the NAND string are floated. Erase bias conditions for the NAND string are applied at step 554. One or more compensation voltages are applied to the NAND string at step 556 to compensate for a voltage coupled to one or more memory cells of the NAND string from neighboring transistors. Steps 554 and 556 are interrelated in that the bias conditions applied at step 554 will depend upon the compensation voltages to be applied at step 556. Thus, these two steps can (but are not required to) be performed simultaneously in some embodiments to apply a set of bias conditions to the NAND string that can include one or more compensation voltages.

After applying the bias conditions and one or more compensation voltages to the NAND string, an erase voltage pulse is applied at step 558. After applying an erase voltage pulse, verification is performed at step 560 to determine whether the NAND string has been sufficiently erased. Numerous means can be used in accordance with embodiments to verify the results of an erase operation. For example, the NAND string may be read in order to determine that the threshold voltage of each of the memory cells of the string is below a specified value. In one embodiment, this can include applying a voltage sufficient to turn on an erased memory cell to the gate of each memory cell and testing conduction of the NAND string in a direction such as from the source to bit line. More details regarding erase and erase verification can be found in co-pending U.S. patent application Ser. No. 10/857,245, entitled COMPREHENSIVE ERASE VERIFICATION FOR NON-VOLATILE MEMORY, incorporated herein by reference in its entirety, which describes a more comprehensive erase verification technique. If the results of the verification at step 560 are successful as determined at step 562, a status of pass is reported for the NAND string at step 564. If, however, it is not determined that the NAND string is sufficiently erased at step 562, a verify counter is checked against a predetermined value at step 566. If the verify counter is less than the predetermined value, for example 20, then the erase voltage pulse (Verase) is incremented by a predetermined value and the verify counter is increased by one at step 570. Operation of the flowchart then continues to step 552 where bias and compensation voltages are again applied to the NAND string before applying an additional erase voltage pulse. If the verify counter is greater than the predetermined number, a status of fail is reported at step 568.

Various compensation voltages can be applied to various portions of a NAND string in order to compensate for voltages coupled to floating gates of select memory cells from neighboring transistors. Accordingly, numerous compensation voltages can be applied at step 556 in order to compensate for these capacitively coupled voltages. FIGS. 15a and 15b depict a set of compensation voltages that can be applied in accordance with one embodiment at steps 554 and 556. Because the bias conditions applied at step 554 are somewhat dependent upon the compensation voltages applied at step 556, FIG. 15a depicts steps 554 and 556 of FIG. 14. FIG. 15a begins by floating the source side select gate and the drain side select gate at step 602. At step 604, 0 volts are applied to the first and last word lines of the NAND string. At step 606, one or more compensation voltages are applied to the remaining word lines of the NAND string, such as the interior word lines of the NAND string. In one embodiment, steps 602–606 are performed simultaneously.

In one embodiment, the compensation voltage(s) applied at step 606 is a positive voltage. By applying a positive voltage to the word lines of the interior memory cells of the NAND string, the electrical field across the tunnel oxide of the interior memory cells is decreased. A portion of the applied compensation voltage couples from the control gate to the floating gate of the interior memory cells. In FIG. 11 for example, application of a compensation voltage to word lines 1 through 6 results in a voltage coupling from each of control gates 404c–414c to their respective floating gates 404f–414f.

The voltage applied to the control gate of an interior memory cell can be chosen in order to equalize the electrical field across the oxide of the interior memory cells with that of the end memory cells of the NAND string. As previously discussed, the end memory cells will have an increased charge over that of the interior memory cells due to coupling from the adjacent select gates. For example, an increase of about 1 volt can be expected in various implementations. Accordingly, a voltage can be applied to the word lines of the interior memory cells to decrease the electrical field for those cells to match that of the end memory cells which have lower electrical fields due to capacitive coupling from the select gates.

Because only a portion of the voltage applied to the word line will couple from the control gate to the floating gate, the voltage applied to the word line can be chosen such that the coupled value will equal the coupled value from the select gate to an end memory cell of a string. Because of fluctuations in parameters, operating conditions, and actual voltages, as used herein, equal voltages can include voltages that are substantially equal. By way of non-limiting example, equal voltages may include substantially equal voltages having values within 0.1 volts or less in some embodiments and within 0.5 volts or less in other embodiments. Assuming 1 volt couples from the select gates to the end memory cells, a voltage can be chosen for application to the word lines such that 1 volt couples from the control gate to the floating gate of the interior memory cells. In many NAND string implementations, about 50% of the voltage applied to a control gate can be expected to couple to a respective floating gate. Accordingly, if it is desired, as in our example, to couple 1 volt to the floating gate of an interior memory cell, about 2 volts can be applied to the control gate via the word lines in order to increase the net charge at the floating gate by 1 volt. By increasing the net charge present at the floating gates of the interior memory cells to be about equal to that of the end memory cells of the NAND string, the electrical field created across the tunnel oxide layers of all memory cells of the NAND string will be about equal under application of a p-well erase voltage pulse.

FIG. 16 is a graph depicting the average threshold voltage of the memory cells of a NAND string, such as depicted in FIG. 11, when applying a compensation voltage such as depicted in FIGS. 15a and 15b. The actual values depicted in FIG. 16 are exemplary only and do not necessarily correspond to the examples previously discussed. The graph depicts the threshold voltage along the Y axis as a function of various compensation voltages depicted along the X-axis. The memory cells of WL0 and WL7 do not receive a compensation voltage and thus exhibit a near constant voltage under application of the compensation voltages to the interior memory cells. After applying an erase voltage pulse, the average threshold voltage of the memory cells of WL0 and WL7 is about −1.5 volts. If no compensation voltage is applied to the interior memory cells, the average threshold voltage of the interior memory cells after application of a single erase voltage pulse is about −2.6 volts. If a compensation voltage of about 0.5 volts is applied to the interior memory cells, the average threshold voltage for the memory cells of WL1–WL6 increases after application of the erase voltage pulse to about −2 volts. The average threshold voltage for the memory cells of WL1–WL6 continues to decrease by applying an increased compensation voltage to those memory cells. At application of a 1 volt compensation voltage to the interior memory cells, the average threshold voltage is decreased to about −1.5 volts. This is the same value for the end memory cells of the NAND string. Thus, if a 1 volt compensation voltage is applied to the interior memory cells, they will erase at about the same rate as the end memory cells of the NAND string.

In this manner, over erasure of the interior memory cells is avoided by slowing their erasure rate to meet that of the end memory cells of the NAND string. The effect of this is to normalize or make substantially equal the threshold voltage distributions of the end memory cells and the interior memory cells of the NAND string. Application of the compensation voltage set forth in FIGS. 15a and 15b will effectively shift the erased threshold voltage distribution of the interior memory cells in the positive direction. For example, distribution 502 of FIG. 12 would be shifted to the right to substantially match that of distribution 504 if the compensation voltage of FIGS. 15a and 15b is applied when erasing the NAND string. In addition to minimizing or eliminating the over erasure of select memory cells, application of a compensation can minimize or eliminate the need for soft programming. Because the distributions of each memory cell will be normalized due to the compensation voltage(s) being applied during erasing, there may be no need to soft program select memory cells so that their threshold voltages will be within the range of the majority or remaining memory cells of the string. This can decrease the time to erase and consequently program a memory system.

FIGS. 17a and 17b depict a set of bias conditions and compensation voltages in accordance with another embodiment that can be applied to a NAND string during an erase operation to compensate for one or more voltages capacitively coupled from neighboring transistors. At step 612, the source side select gate and drain side select gate of the NAND string are floated. At step 614, a compensation voltage is applied to the end word lines of the NAND string. Zero volts are applied to the remaining word lines of the NAND string at step 616. In the embodiment depicted in FIGS. 17a and 17b, the compensation voltages are applied to the end word lines rather than the interior word lines of the NAND string in order to directly compensate for the voltage coupled to the memory cells of the end word lines.

In one embodiment, the compensation voltage applied to the first and last word lines of the NAND string is negative in order to increase the electrical field across the tunnel oxide of the memory cells of the first and last word lines. As previously discussed, the first and last memory cells will have a lower electrical field across their tunnel oxide than the remaining word lines of the NAND string due to capacitive coupling from the select gates. Accordingly, a voltage can be applied to the word lines of these memory cells in order to couple a voltage from the control gate to the floating gate of the memory cell in order to compensate for the voltage coupled from the adjacent select gate. As previously described, only a portion of the voltage applied to the control gate will couple to the floating gate. Accordingly, the voltage applied to the word line can be chosen such that the amount of voltage coupled to the floating gate is equal in magnitude and opposite in polarity to that coupled from the adjacent select gate.

For example, if +1 volt couples from the select gate to the floating gate of an end memory cell, then a voltage of −2 volts can be applied to the word line of the end memory cells in order to couple a voltage of about −1 volt to the floating gate. The −1 volt coupled from the control gate will compensate for the +1 volt coupled from the adjacent select gate. Thus, the electrical field across the tunnel oxide of the end memory cells is increased such that it equals that of the other memory cells of the NAND string. Accordingly, the potential across the tunnel oxide layers of each of the memory cells of the string is made equal such that each memory cell will exhibit a similar erase behavior and erase at substantially the same rate. Because of fluctuations in parameters, operating conditions, and actual voltages, an equal potential as used herein can include substantially equal potentials including, for example, potentials within 0.1 volt or less in some embodiments and within 0.5 volts or less in other embodiments. Applying the compensation voltage of FIGS. 17a and 17b will shift the threshold voltage distribution of the memory cells of the end word lines after application of an erase voltage in a negative direction. Looking again at FIG. 12, distribution 504 will effectively be shifted to the left (in a negative direction) such that it coincides with that of distribution 502 because of application of the negative compensation voltage to the end word lines.

In addition or alternatively to capacitively coupled voltages from select gates to the end word lines of a NAND string, there are additional capacitively coupled voltages that can be taken into consideration to more precisely compensate for voltages coupled from adjacent or neighboring transistors. FIG. 11 illustrates an additional capacitive coupling effect between the floating gates of individual memory cells of the NAND string by arrows 436. For example, a portion of the voltage present at the floating gate of memory cell 416, connected to WL0, will capacitively couple to the floating gate of memory cell 414, connected to WL1. A portion of the voltage present at the floating gate of memory cell 414 will couple to the floating gate of memory cell 412, connected to WL2, and so on. This coupling may additionally or alternatively exist in the opposite direction, for example, from memory cell 412 to memory cell 414, as indicated by the double head on arrows 436. These coupling effects will be seen among all memory cells of the NAND string at various levels. The net charge at each floating that can couple to a neighboring floating gate is less than that present at the select gates. Thus, the amount of voltage coupled between the floating gates of individual memory cells will be less than that coupled to the end memory cells from adjacent select gates. Nevertheless, each memory cell of the NAND string can be expected to have a slightly differing net charge present at its floating gate and a correspondingly different erase behavior due to such coupling.

In accordance with one embodiment, a compensation voltage is applied to one or more memory cells of the NAND string in order to compensate for each of these capacitively coupled voltages. For example, each memory cell of the NAND string can receive a compensation voltage while applying an erase voltage pulse in order to normalize the electrical field across the tunnel oxide of each memory cell of the NAND string. An equal electrical field potential can thus be created across the tunnel oxide layers of each memory cell in order to erase each of the memory cells at the same rate and to the same degree. In one embodiment, for example, a compensation voltage can be applied to the end word lines in order to compensate for voltages coupled from the adjacent select gates. Other compensation voltages can be applied to the interior memory cells to compensate for voltages coupled from adjacent memory cells. Referring to FIG. 11, for example, a compensation voltage can be applied to WL1 to compensate for a voltage coupled to memory cell 414 from memory cells 416 and 412. In one embodiment, this voltage can be chosen under the previously described analysis assuming a 50% coupling ratio from adjacent memory cells.

In another embodiment, the voltage applied to each individual word line of the NAND string can be chosen by comparing the erase behavior of a memory cell connected to a selected word line with another memory cell in the string. For example, one memory cell of the string can be chosen as a reference memory cell and its erase behavior determined during testing. The remaining memory cells can be tested under application of increased erase voltage pulses and compared with this reference memory cell. If the memory cell erases slower than the reference memory cell, an appropriate compensation voltage, such as a negative compensation voltage, to increase the electrical field across that memory cell's tunnel oxide can be chosen. If the memory cell erases faster than the reference memory cell, a positive compensation voltage can be chosen for that word line to slow down the erase rate of the memory cell to match that of the reference memory cell. It will be appreciated by those of ordinary skill in the art that various techniques for choosing a compensation voltage can be made in accordance with embodiments and according to the erase behavior of memory cells in a particular implementation.

FIGS. 18a and 18b depict a set of bias and compensation voltages wherein each memory cell of the NAND string receives a particularized compensation voltage chosen for each word line and memory cell. Numerous means as heretofore described can be used to choose the compensation voltage such as by comparison of the memory cell with a reference memory cell or by computations assuming various coupling ratios amongst neighboring transistors and the well region. At step 622, the source side select gate and the drain side select gate are floated. At step 624, the individual compensation voltages are applied to each word line of the NAND string. After applying the compensation voltages and floating the source and drain side select gates, an erase voltage pulse is applied. By applying individual compensation voltages to each of the word lines, the voltage distribution of each of the memory cells will be made substantially equal. Depending upon the manner in which the compensation voltages are chosen, the threshold voltage distributions depicted in FIG. 12 will shift in various ways. For example, if a fast erasing memory cell is chosen as a reference memory cell, it can be expected that distribution 504 for the end word lines of the NAND string will shift to the left because these memory cells will now erase faster under application of an appropriate compensation voltage (e.g., a negative compensation voltage to increase the potential across the tunnel oxide and increase the erase rate). If, however, a slow erasing cell is chosen as a reference storage element, distribution 502 of the interior memory cells can be expected to shift to the right because erasure of those memory cells will be slowed under application of the appropriate compensation voltage (e.g., a positive compensation voltage to decrease the potential across the tunnel oxide and decrease the erase rate). By choosing individual compensation voltages in one embodiment, it can be expected that distribution 502 will shift to the right and distribution 504 will shift to the left, thus equalizing in between.

Figures 19A, 19B:
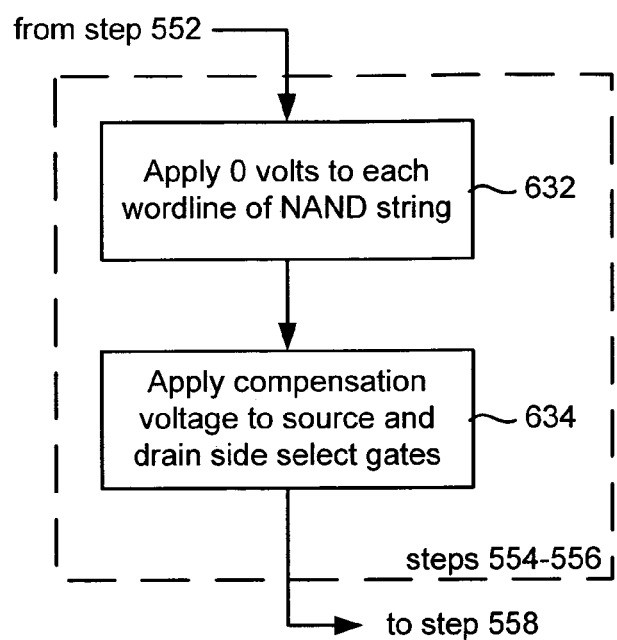
FIG. 19a is a flowchart depicting a method of applying erase bias conditions and one or more compensation voltages in accordance with one embodiment.
FIG. 19b is a table including erase bias conditions and compensation voltages in accordance with one embodiment.

In one embodiment, a compensation voltage is applied to one or more select gates of the NAND string as depicted in FIGS. 19a and 19b in order to compensate for one or more capacitively coupled voltages. A compensation voltage can be applied to a select gate in order to compensate for a voltage coupled to the select gate from the p-well region. A voltage applied directly to a select gate will be present at the control gate of the select gate and a portion thereof will couple to adjacent memory cells of the NAND string. Because a voltage is applied to the select gate, the p-well erase voltage will not couple to the select gate. Thus, a portion of the applied voltage rather than the erase voltage will couple from the select gate to the adjacent memory cell.

At step 632 of FIG. 19a, 0 volts is applied to each word line of the NAND string. At step 634, one or more compensation voltages are applied to the select gates of the NAND string. After biasing the NAND string for the erase operation and applying compensation voltages, an erase voltage pulse is applied to the NAND string. In accordance with various embodiments, various compensation voltages can be applied to the select gates at step 634. A positive compensation voltage that is less than the erase voltage pulse can be applied to decrease the amount of voltage coupled to the memory cells adjacent to the select gates. The closer the value is to zero volts, the lower the amount of voltage that will couple to the adjacent select gates.

If 0 volts is applied to a select gate, no voltage will be present at the select gate to couple to an adjacent memory cell. This may initially seem to provide the best alternative for normalizing the erase behavior of the various memory cells. However, considerations must be made when choosing the voltage applied to the select gates in order to avoid too high of a potential across the tunnel oxide layer of the select gate. Thus, while it may seem desirable to apply 0 volts to the select gates in order to eliminate any coupling to adjacent memory cells, application of such a low voltage may create a high potential across the tunnel oxide layer that results in damage and possible breakdown of the select gate. In an embodiment including an 80 angstrom tunnel oxide layer for example, the maximum potential created across the tunnel oxide layer of the select gate should be limited to around 4 or 5 volts. If the voltage applied to the select gate is low enough such that the potential created across the layer (erase voltage pulse minus compensation voltage) increases beyond this limit, a breakdown of the transistor may occur. If the potential created across the tunnel oxide layer of the select gates is to be limited to about 4 or 5 volts and an erase voltage pulse of about 20 volts is being applied, the minimum compensation voltage should be about 15 or 16 volts. A portion of the compensation voltage will couple to the adjacent memory cells. As previously described about 5% to 10% of the voltage present at the select gates will couple to an adjacent memory cell. Although there is still some voltage coupled to the adjacent memory cell the portion of the 15 or 16 volts that will couple is less than the portion of the applied erase voltage (20v) that would couple if the compensation voltage were not applied. Thus, the erase behavior of the end memory cells can be normalized to a substantial degree with the remaining memory cells of the NAND string.

In accordance with various embodiments, one or more of the methods depicted with respect to FIGS. 15–19 can be used in conjunction with one another. For example, a compensation voltage can be applied to both the end word lines of the NAND string and the interior word lines of the NAND string. A positive compensation voltage can be applied to the interior memory cells to decrease the electrical field across their tunnel oxide layers while a negative compensation voltage can be applied to the end word lines of the NAND string in order to increase the electrical field across their tunnel oxide layers, thus resulting in an equalization amongst all electrical fields for each memory cell. In another embodiment, an individualized compensation voltage can be applied to each word line of the NAND string along with a compensation voltage being applied to the select gates of the NAND string in order to normalize the erase behavior of each of the memory cells. A compensation voltage (e.g., 15 volts) can be applied to the select gates in order to couple a smaller voltage to the adjacent memory cells. Since this will not eliminate all coupling to the end word lines of the NAND string, these word lines will still erase at a somewhat slower rate than the remaining word lines. To make up for the remaining difference in erase behavior, a compensation voltage can also be applied to the interior memory cells of the NAND string to decrease their electrical fields and/or the end word lines of the NAND string in order to increase their electrical fields.

The above examples are provided with respect to NAND type flash memory. However, the principles of the present invention have application to other types of non-volatile memories which utilize a serial structure, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of erasing non-volatile storage, comprising:
applying compensation to a portion of a string of non-volatile storage elements to at least partially compensate for a voltage coupled to one or more non-volatile storage elements of said string from at least one transistor of said string, said applying compensation includes applying a first compensation voltage to a first non-volatile storage element of said string and a second compensation voltage to a second non-volatile storage element of said string, said first compensation voltage includes at least one of a different magnitude and a different polarity than said second compensation voltage;
applying a third voltage to a third non-volatile storage element of said string, said third voltage includes at least one of a different magnitude and a different polarity than said first compensation voltage, said third voltage includes at least one of a different magnitude and a different polarity than said second compensation voltage; and
transferring charge from a floating gate of at least a subset of non-volatile storage elements of said string while applying said compensation in order to erase said string of non-volatile storage elements, said subset of non-volatile storage elements includes said first non-volatile storage element, said second non-volatile storage element and said third non-volatile storage element.

2. The method of claim 1, wherein:
said method further comprises applying an erase voltage to a well of said string of non-volatile storage elements; and
said step of transferring charge includes transferring charge from a floating gate of said first non-volatile storage element and a floating gate of said second non-volatile storage element to said well.

3. The method of claim 2, wherein:
said step of applying said erase voltage causes a first potential to exist between said floating gate of said first non-volatile storage element and said well, and causes a second potential to exist between said floating gate of said second non-volatile storage element and said well.

4. The method of claim 3, wherein:
said applying said first compensation voltage and applying said second compensation voltage cause said first potential and said second potential to be equal.

5. The method of claim 1, wherein:
said at least one transistor includes a select gate of said string;
said second non-volatile storage element is interior to said first non-volatile storage element of said string; and
said first compensation voltage is less than said second compensation voltage.

6. The method of claim 5, wherein:
said first compensation voltage is negative; and
said second compensation voltage is positive.

7. The method of claim 5, wherein:
said first compensation voltage is positive; and
said second compensation voltage is positive.

8. The method of claim 5, wherein:
said applying said first compensation voltage at least partially compensates for a coupled voltage coupled to a floating gate of said first non-volatile storage element from said select gate.

9. The method of claim 8, wherein:
said applying said first compensation voltage couples a portion of said first compensation voltage to said floating gate of said first non-volatile storage element, said portion of said first compensation voltage is equal in magnitude and opposite in polarity to said coupled voltage coupled to said floating gate of said first non-volatile storage element.

10. The method of claim 5, wherein said applying said second compensation voltage to said control gate of said second non-volatile storage element at least partially compensates for a coupled voltage coupled to a floating gate of said first non-volatile storage element from said select gate.

11. The method of claim 10, wherein said step of applying said second compensation voltage couples a portion of said second compensation voltage to a floating gate of said second non-volatile storage element, said portion of said second compensation voltage is equal in magnitude and equal in polarity to said coupled voltage coupled to said floating gate of said first non-volatile storage element.

12. The method of claim 1, wherein:
said method further comprises applying at least one different compensation voltage to a control gate of each remaining non-volatile storage element of said string to at least partially compensate for a voltage coupled to said each remaining non-volatile storage element from at least one neighboring transistor.

13. The method of claim 12, wherein:
said at least one different compensation voltage includes a different magnitude for at least two of said remaining non-volatile storage elements.

14. The method of claim 12, wherein:
said step of applying said at least one different compensation voltage includes, for said each remaining non-volatile storage element, selecting a magnitude and polarity of said second compensation voltage based on an erase behavior of said each remaining non-volatile storage element compared with a reference non-volatile storage element.

15. The method of claim 14, wherein:
said reference non-volatile storage element is a selected non-volatile storage element of said string.

16. The method of claim 1, wherein:
said at least one transistor includes a select gate of said string;
said step of applying compensation to a portion of said string comprises applying a third compensation voltage to said select gate.

17. The method of claim 16, wherein:
said method further comprises applying an erase voltage to a well of said string of non-volatile storage elements;
said third compensation voltage is less than said erase voltage; and
said step of transferring charge includes transferring charge from said floating gate of said at least a subset of said non-volatile storage elements to said well.

18. The method of claim 17, wherein:
a difference between said erase voltage and said third compensation voltage is about five volts.

19. The method of claim 1, wherein:
said string of non-volatile storage elements is a NAND string.

20. The method of claim 1, wherein:
said string of non-volatile storage elements is a string of multi-state flash memory devices.

21. The method of claim 1, wherein:
said string of non-volatile storage elements is part of an array of non-volatile storage element;
said array is in communication with a host system; and
said array is removable from said host system.

22. A non-volatile memory system, comprising:
a string of non-volatile storage elements, said string includes at least one select gate; and
a managing circuit in communication with said string of non-volatile storage elements, said managing circuit erases said string of non-volatile storage elements by applying a first compensation voltage to a first non-volatile storage element, a second compensation voltage to a second non-volatile storage element, and a third voltage to a third non-volatile storage element to at least partially compensate for a voltage coupled to one or more non-volatile storage elements of said string from at least one transistor of said string while charge is transferred from floating gates of at least a subset of said non-volatile storage elements, said first compensation voltage includes at least one of a different magnitude and a different polarity than said second compensation voltage, said third voltage includes at least one of a different magnitude and a different polarity than said first compensation voltage, said third voltage includes at least one of a different magnitude and a different polarity than said second compensation voltage, said subset of non-volatile storage elements includes said first non-volatile storage element, said second non-volatile storage element and said third non- volatile storage element.

23. The non-volatile memory system of claim 22, wherein:
said second non-volatile storage element is interior to said first storage element of said string; and
said managing circuit applies said first compensation voltage to a control gate of said first non-volatile storage element, and applies said second compensation voltage to a control gate of said second non-volatile storage element.

24. The non-volatile memory system of claim 23, wherein:
said managing circuit applies an erase voltage to a well of said string of non-volatile storage elements to transfer charge from a floating gate of said first non-volatile storage element to said well and from a floating gate of said second non-volatile storage element to said well;

applying said erase voltage causes a first potential to exist between said floating gate of said first non-volatile storage element and said well and a second potential to exist between said floating gate of said second non-volatile storage element and said well; and said first potential and said second potential are equal under application of said first compensation voltage, said second compensation voltage, and said erase voltage.

25. The non-volatile memory system of claim 23, wherein:
said at least one transistor includes said at least one select gate;
said managing circuit applying said first compensation voltage at least partially compensates for a coupled voltage coupled to said floating gate of said first non-volatile storage element from said at least one select gate;
a portion of said first voltage couples to said floating gate of said first non-volatile storage element; and
said managing circuit applies said first compensation voltage at a magnitude and polarity such that said portion of said first compensation voltage is equal in magnitude and opposite in polarity to said coupled voltage.

26. The non-volatile memory system of claim 23, wherein:
said at least one transistor includes said at least one select gate;
said managing circuit applying said second compensation voltage at least partially compensates for a coupled voltage coupled to said floating gate of said first non-volatile storage element from said at least one select gate;
a portion of said second compensation voltage couples to said floating gate of said second non-volatile storage element; and
said managing circuit applies said second compensation voltage at a magnitude and polarity such that said portion of said second compensation voltage is equal in magnitude and equal in polarity to said coupled voltage.

27. The non-volatile memory system of claim 22, wherein:
said at least one transistor includes said at least one select gate;
said managing circuit applies a third compensation voltage to said at least one select gate while charge is transferred from said floating gates of said at least a subset of said plurality of non-volatile storage elements;
said managing circuit applies an erase voltage to a well of said string of non-volatile storage to transfer charge from said floating gates of said at least a subset of said non-volatile storage elements to said well; and
said third compensation voltage is less than said erase voltage.

28. The non-volatile memory system of claim 22, wherein:
said string of non-volatile storage elements is a NAND string including multi-state flash memory devices.

29. The non-volatile memory system of claim 22, wherein:
said string of non-volatile storage elements is part of an array of non-volatile storage elements;
said array is in communication with a host system; and
said array is removable from said host system.

30. The non-volatile memory system of claim 22, wherein:
said managing circuit includes at least one of a controller and a state machine.

31. A method of erasing non-volatile storage, comprising:
applying a first voltage to a control gate of a first non-volatile storage element of a set of non-volatile storage elements, said set includes at least one select gate;

applying a first compensation voltage to a control gate of a second non-volatile storage element of said set of non-volatile storage elements, said first compensation voltage is different from said first voltage;

applying a second compensation voltage to a control gate of a third non-volatile storage element of said set of non-volatile storage elements, said second compensation voltage is different from said first voltage and said first compensation voltage;

transferring charge from a floating gate of said first non-volatile storage element, a floating gate of said second non-volatile storage element, and a floating gate of said third non-volatile storage element while applying said first voltage, said first compensation voltage, and said second compensation voltage in order to erase said first non-volatile storage element, said second non-volatile storage element, and said third non-volatile storage element.

32. The method of claim 31, wherein:
said set of non-volatile storage elements is a NAND string;
said first non-volatile storage element is adjacent to said at least one select gate; and
said second non-volatile storage element and said third non-volatile storage element are interior storage elements of said NAND string, said first compensation voltage is positive and at least partially compensates for a voltage coupled to said first non-volatile storage element from said at least one select gate in order to at least partially equalize the erase behavior of said first non-volatile storage element and said second non-volatile storage element, said second compensation voltage is positive and at least partially compensates for a voltage coupled to said first non-volatile storage element from said at least one select gate in order to at least partially equalize the erase behavior of said first non-volatile storage element and said second non-volatile storage element.

33. The method of claim 31, wherein:
said set of non-volatile storage elements is a NAND string;
said first non-volatile storage element is an interior storage element of said NAND string; and
said second non-volatile storage element is adjacent to said select gate, said first compensation voltage is negative and at least partially compensates for a voltage coupled to said second non-volatile storage element from said select gate in order to at least partially equalize the erase behavior of said first non-volatile storage element and said second non-volatile storage element.

34. The method of claim 1, wherein:
said third voltage is zero volts;
said first and second compensation voltages are less than a voltage required to be applied to a control gate of a non-volatile storage element of said string to inhibit a transfer of charge from a floating gate of a non-volatile storage element during application of an erase voltage to a well region of said string.

35. The method of claim 1, further comprising:
floating a select gate of said string while transferring charge from said floating gate of at least a subset of non-volatile storage elements of said string.

36. The method of claim 2, further comprising:
floating a select gate of said string while transferring charge from said floating gate of at least a subset of non-volatile storage elements of said string.

37. The method of claim 16, wherein:
said first compensation voltage is greater than 0 volts and less than 5 volts.

38. The non-volatile memory system of claim 22, wherein:
said third voltage is zero volts;
said first and second compensation voltages are less than a voltage required to be applied to a control gate of a non-volatile storage element of said string to inhibit a transfer of charge from a floating gate of a non-volatile storage element during application of an erase voltage to a well region of said string.

39. The non-volatile memory system of claim 22, wherein:
said at least one select gate includes a first select gate;
said managing circuit floats a first select gate of said string while transferring charge from said floating gate of at least a subset of non-volatile storage elements of said string.

* * * * *